United States Patent
Merchant et al.

(10) Patent No.: US 6,410,986 B1
(45) Date of Patent: Jun. 25, 2002

(54) MULTI-LAYERED TITANIUM NITRIDE BARRIER STRUCTURE

(75) Inventors: Sailesh Mansinh Merchant; Pradip Kumar Roy, both of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/218,574

(22) Filed: Dec. 22, 1998

(51) Int. Cl.[7] ............................................... H01L 23/52
(52) U.S. Cl. ...................... 257/763; 257/760; 257/764
(58) Field of Search ................................. 257/763, 758, 257/764, 760, 770; 438/683, 685, 648, 656

(56) References Cited

U.S. PATENT DOCUMENTS

| | | | | |
|---|---|---|---|---|
| 4,783,248 A | * | 11/1988 | Kohlhase et al. | 204/192.17 |
| 5,240,880 A | * | 8/1993 | Hindman et al. | 437/190 |
| 5,395,795 A | * | 3/1995 | Hong et al. | 437/190 |
| 5,652,464 A | * | 7/1997 | Liao et al. | 257/751 |
| 5,668,411 A | * | 9/1997 | Hong et al. | 257/751 |
| 6,028,003 A | * | 2/2000 | Frisa et al. | 438/653 |
| 6,171,717 B1 | * | 1/2001 | Chang et al. | 428/698 |

FOREIGN PATENT DOCUMENTS

| | | | | |
|---|---|---|---|---|
| JP | 403153024 A | * | 7/1991 | 21/28 |
| JP | 411067686 A | * | 3/1999 | 21/28 |

* cited by examiner

Primary Examiner—Tom Thomas
Assistant Examiner—Douglas W. Owens
(74) Attorney, Agent, or Firm—Wendy W. Koba

(57) ABSTRACT

A titanium nitride barrier within an integrated contact structure is formed as multi-layered stack. The multi-layering of the titanium nitride thus provides improved junction integrity since the multi-layer structure exhibits improved mechanical stability when compared to conventional single layer arrangements. The multi-layer titanium nitride barrier may be used as either a conventional interconnect metallization or as a nucleation structure within a tungsten plug. The multi-layer structure may be formed to include an overall thickness less than a conventional single layer, yet provide for improved stress accommodation, resulting in eliminating micro-cracks within the titanium nitride (and as a result eliminating the un-wanted diffusion of aluminum or tungsten precursors through the titanium nitride).

6 Claims, 2 Drawing Sheets

MULTI-LAYERED TITANIUM NITRIDE BARRIER STRUCTURE

BACKGROUND OF THE INVENTION

The present invention relates to a titanium nitride barrier structure for use in the metallization of integrated circuit devices and, more particularly, to the use of a multi-layer titanium nitride structure that exhibits optimal stress characteristics while maintaining a relatively thin layer profile.

In the semiconductor integrated circuit industry, titanium nitride (TiN) is commonly used as an underlayer for aluminum-alloy metallization contacts on silicon-based devices, as well as a nucleation layer in contact vias for the tungsten plugs. FIG. 1 illustrates an exemplary arrangement where TiN is used as a contact underlayer. As shown, a first titanium layer 10 is deposited to cover a dielectric layer 12 on the surface of substrate 14. Titanium layer 10 is used to aid the adherence of TiN layer 16 to dielectric layer 12. An aluminum-alloy (Al-alloy) contact layer 18 is then deposited over TiN layer 16. An additional TiN overlayer 20 may be deposited over Al-alloy contact layer 18 to reduce the reflectivity of contact layer 18 during subsequent lithography process. An exemplary arrangement where TiN is used as a nucleation layer is shown in FIG. 2. In this case, a first Ti layer 30 is deposited to cover sidewalls 32 and floor 34 of via 36. A TiN layer 38 is then deposited over Ti layer 30, followed by the tungsten (W) plug material 40.

In either embodiment, the titanium nitride is typically deposited using physical vapor deposition (PVD) or sputtering. As illustrated above, a Ti layer is first formed, since TiN does not adhere well to a silicon surface. A pure Ti target may be used to deposit the initial titanium layer, using an argon (Ar) atmosphere. Subsequent to the formation of the initial Ti layer, nitrogen gas may be introduced to effect the formation of TiN on the titanium surface. Particularly, the $N_2$ gas can react at one or more places with the Ti atoms. Moreover, the $N_2$ gas can react with the Ti target and form a layer of TiN on the surface of the target. Such a mode of deposition is often defined in the art as the "nitrided", "poisoned", or "non-metallic" mode of TiN deposition, since the Ti target is "poisoned"—only TiN will now be possible with this target (that is, if the process calls for subsequent deposition of pure titanium, the target must either be cleaned or replaced). Alternatively, the $N_2$ gas can react with the Ti atoms that have been released by the target and are in the atmosphere between the target and wafer surface, as well as with the titanium atoms on the wafer surface itself. In both cases, a TiN layer will be formed on the wafer. This mode of deposition is commonly referred to in the art as "non-nitrided", "non-poisoned", or "metallic", since metallic Ti atoms are sputtered from the Ti target, even though TiN is ultimately deposited on the wafer.

Since the two deposition processes are different, significant variations in TiN film properties can be envisioned when depositing TiN in either mode. For example, the deposition rate in the "metallic" mode (i.e., "non-poisoned") is about two to three times faster than the deposition rate in the non-metallic mode (i.e., "poisoned"). With ever-decreasing dimensions of silicon integrated circuits, contact (FIG. 1) and via (FIG. 2) sizes are also decreasing. As the aspect ratio (i.e., the ratio of height-to-diameter) of these openings increases, the conventional sputtering techniques described above begin to become problematic. For example, these methods can no longer provide adequate TiN film thickness along the sidewalls or bottom wall of contact vias—precisely the areas where these barriers are most needed. The simple solution of merely lengthening the process time to form a thicker TiN barrier layer is not acceptable, since the layer then exhibits unreasonably high levels of mechanical stress. Additionally, thick sputtered TiN films tend to form micro-cracks to relieve this stress, where these micro-cracks then form unwanted diffusion paths for the subsequently deposited aluminum (or other fluorine-containing gas species used in subsequent tungsten deposition).

One solution to this problem is to use a chemical-vapor deposition (CVD) process for the titanium nitride. Although a CVD-TiN process addresses the concerns mentioned above, the process itself is expensive and time-consuming—requiring extensive investment in the specialized equipment necessary to perform the CVD process. Moreover, the CVD process requires the use of certain precursor chemicals to initiate the formation of the TiN, and the impurity content of these precursors may be unacceptable for certain fine-line sub-micron integrated circuit applications.

Therefore, a need remains in the art for overcoming the thickness-limited problems associated with sputtered TiN films while requiring the use of a completely different fabrication process.

SUMMARY OF THE INVENTION

The need remaining in the art is addressed by the present invention, which relates to a titanium nitride barrier structure for use in the metallization of integrated circuit devices and, more particularly, to the use of a multi-layer titanium nitride structure that exhibits optimal stress characteristics while maintaining a relatively thin layer profile.

In accordance with the present invention, a plurality of relatively thin TiN layers are deposited, using the well-known deposition techniques described above, to form a multi-layer TiN structure of the desired thickness. The multi-layer structure results in improved coverage of via sidewall and bottom surfaces, while the multi-layer structure also allows for inter-layer stress accommodation so as to avoid the mechanical stress problems associated with the relatively thick TiN layers of the prior art.

In a first embodiment of the present invention, "chemical" multi-layering of TiN is performed, where the chemical composition of the TIN structure is altered, layer by layer, during the deposition process. That is, the ratio of $N_2$ gas to argon gas ($N_2$/Ar) is altered to form TiN layers of various compositions and different N/Ti ratios or stoichiometry. For example, for a given Ar content (e.g., 55 sccm), the $N_2$ content may be altered between 15 and 65 sccm. Additionally, "chemical" multi-layering can be achieved by alternating between the two types of deposition described above, variously referred to as "nitrided" and "non-nitrided".

In an alternative embodiment of the present invention, "thermal" multi-layering of TiN may be used, where the TiN multi-layer structure is formed using at least two chambers having different ambient temperatures, for example, one chamber maintained at room temperature and a second chamber maintained at 400° C. When the TiN layers are deposited at different temperatures, the stress state of each layer is altered, allowing for inter-layer stress accommodation and the prevention of micro-crack formation.

A third embodiment of the present invention, referred to as "mechanical" multi-layer may also be used. In a first arrangement of this embodiment, mechanical interfaces between the TiN layers are formed by interleaving pure Ti layers with the TiN layers, thus forming the necessary stress accommodation interfaces. Alternatively, "pseudo-interfaces" can be formed by, for example, altering the power level during TiN deposition or deliberately interrupting the deposition process. Any of these techniques results in the creation of "interfaces" within the multi-layer TiN structure. It is to be noted that the Ti/TiN/Ti/TiN . . . mechanical multi-layer arrangement should only be used with aluminum alloys, since the titanium is known to react with tungsten and would therefore have a deleterious effect on the tungsten plug in a via structure.

Various other embodiments of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
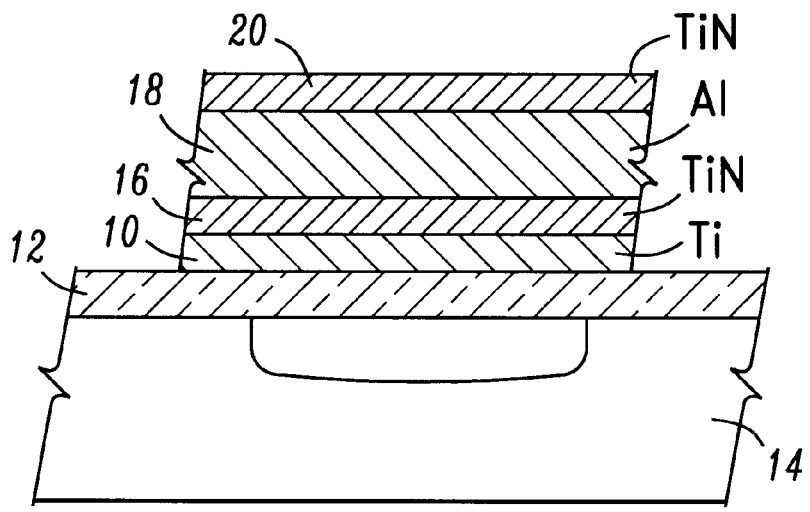
FIG. 1 illustrates a prior art aluminum-alloy contact structure including a TiN barrier layer.
Figure 2:
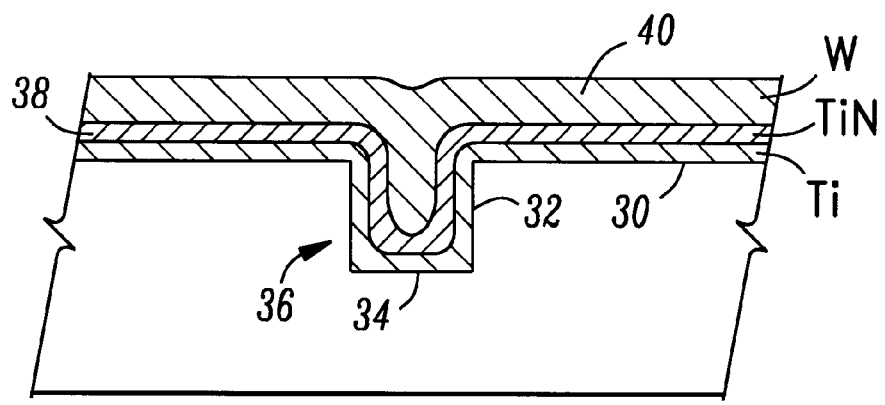
FIG. 2 illustrates a prior art tungsten contact plug including a TiN nucleation layer.
Figure 3:
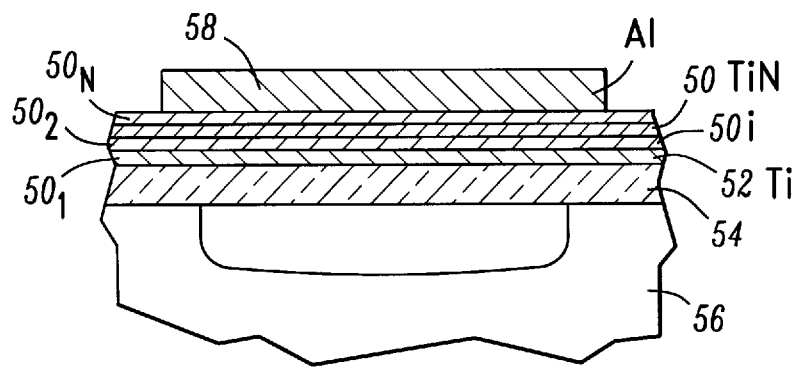
FIG. 3 illustrates an aluminum-alloy contact including a multi-layer TiN structure formed in accordance with the present invention.

FIG. 3 illustrates an exemplary contact arrangement utilizing a multi-layer TiN barrier structure with an aluminum-alloy contact layer. The arrangement as depicted in FIG. 3 is somewhat enlarged when compared to the prior art contact structure in FIG. 1 to aid in the clarity of the multi-layer illustration. In practice, however, an advantage of the multi-layer structure of the present invention is that each individual layer within the multi-layer TiN structure is significantly thinner than a conventional, single layer prior art TiN barrier.

Referring to FIG. 3, a multi-layer TiN structure 50, formed as will be discussed in detail hereinbelow, is deposited over an initial titanium adherence layer 52 disposed on a dielectric layer 54 formed on the surface of a substrate 56. An aluminum-alloy contact 58 is then formed on multi-layer TiN structure 50. In accordance with the present invention, multi-layer TiN structure 50 comprises a plurality of separate layers, denoted $50_1, 50_2, \ldots 50_N$, where the number (as well as the thickness) of individual layers is considered to be a matter of design choice. Indeed, even a "dual" layer structure will provide some degree of improvement in terms of stress accommodation and robustness (in terms of capability to withstand elevated temperatures) when compared to the prior art single layer arrangements. However, multiple, thin layers are considered to be advantageous in terms of providing optimal stress relief (as well as improved conformal coating, as will be discussed below in association with FIG. 4).

There are various processing techniques, or combinations of techniques, that may be used to form the multi-layer TiN structure of the present invention. In general, these processing techniques can be categorized as "chemical multi-layering", "thermal multi-layering" and "mechanical multi-layering" and each is capable of forming separate and distinct, yet extremely thin (on the order of 100–300 Å) layers of TiN so as result in the production of the multi-layer TiN structure. In general, the utilization of the multi-layer structure has been shown to exhibit improved stress accommodation, mechanical stability and resistance to electromigration when compared with the conventional "single layer" prior art TiN barrier layer structure.

In the chemical multi-layering process, the chemical composition of each layer $50_i$ is altered during the deposition process. The various layers deposited using this method may be also be defined as "functionally gradient materials" or "chemically graded materials". In particular, the ratio of the $N_2$ gas to the argon (Ar) gas (used with either the "nitrided" or "non-nitrided" PVD processes discussed above) used for the deposition of TiN layers is altered to form separate TiN layers $50_i$ of various compositions and different N/Ti ratios or stoichiometry. Moreover, chemical multi-layers structures can be obtained by depositing several layers of TiN by continuously altering the deposition process —that is, alternating between the above-described "nitrided" deposition technique and the "non-nitrided" technique. The alternation of these methods will continuously alter the chemical composition of the TiN within the entire structure 50 and thereby obtain the multi-layered TiN structure with optimal chemical properties. For example, for a given Ar content (e.g., 55 sccm), the $N_2$ content may be altered between 15 sccm (for the "non-nitrided" process) and 65 sccm (for the "nitrided" process). Further, it can be shown that the TiN density significantly alters within the multi-layer structure as a function of the mode of deposition; nitrided TiN layers are generally denser that the non-nitrided TiN lay density has been shown to exhibit superior barrier properties (less stress, better mechanical integrity) and improved junction integrity.

The "chemical multi-layered" TiN structure of the present invention also exhibits significant variation in stress through the thickness of the structure. The stress in the multi-layered TiN structure can be tailored, in accordance with the present invention, by altering the stoichiometry of the individual layers $50_i$. For example, the stress of "non-nitrided" layers can be made tensile and the stress of the "nitrided" layers can be compressive so that the overall multi-layered structure stress is minimal (essentially zero).

The plurality of separate TiN layers $50_i$ within TiN structure 50 can also be formed by varying the ambient temperature during the deposition process, where this process is terms "thermal multi-layering". In one exemplary thermal multi-layering process, the TiN layers may be deposited using two chambers, where the temperature in the first chamber is maintained at a temperature that is significantly different than the temperature in the second chamber. When the layers are deposited at different temperatures, the stress state of each film is altered, thereby lowering the propensity of the multi-layered TiN structure to crack and form fast diffusion paths for the overlying Al layer 58. For example, the stress of a TiN structure can vary by as much as 1500 Mpa by depositing a first TiN layer $50_1$ at room temperature, a second TiN layer $50_2$ at an elevated temperature (e.g., 400° C.), a third TiN layer at room temperature, and so on, until the desired "stack" thickness is obtained. In general, more than two deposition temperatures may be used, simply by including additional deposition chambers maintained at different temperatures. As with the "chemical multi-layering" process described above, the "deposition mode" (i.e., "nitrided" and "non-nitrided") may be altered in combination with the thermal multi-layering process to provide additional differential in the density and other properties of each separate TiN layer $50_i$ within multi-layer TiN structure 50.

"Mechanical multi-layering" may also be used to form multi-layer TiN structure 50 and in this technique the microstructure of each TiN layer $50_i$ is deliberately layered by the creation of "pseudo-interfaces" within the multi-layer structure. For example, different power levels (for example 7kW and 12 kW) may be used during deposition to create these artificial interfaces. Alternatively, the deposition process may be interrupted (halted) for a predetermined period of time (in a preferred embodiment, between 1 and 3 seconds) during the TiN deposition process so as to create "virtual" interfaces between each deposited TiN layer as a result of microstructure mismatch. The deliberate microstructure mismatch causes unaligned grain boundaries and minimizes the fast diffusion of the overlying aluminum layer 58.

Figure 4:
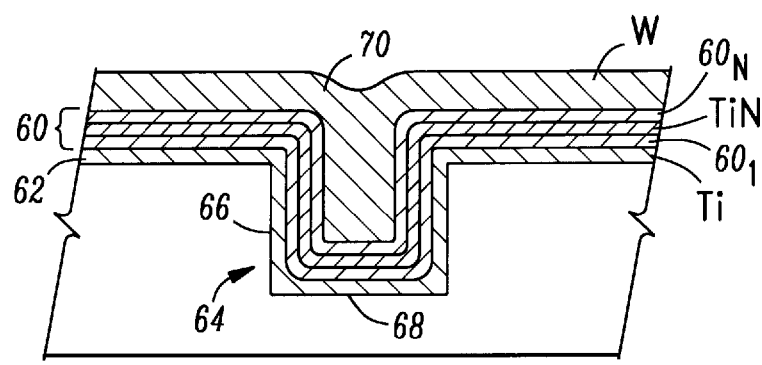
FIG. 4 illustrates a tungsten contact plug including a multi-layer TiN structure formed in accordance with the present invention.

FIG. 4 illustrates an exemplary tungsten plug arrangement using a multi-layered TiN nucleation structure formed in accordance with the present invention. As shown, a multi-layered TiN structure 60 is formed over an initial Ti layer 62 formed to cover the associated surface area and interior region of a via 64, including sidewalls 66 and bottom surface 68 of via 64. A tungsten contact plug 70 is then formed to "fill" via 64. As with the contact barrier arrangement of FIG. 3, TiN nucleation structure 60 comprises a plurality of separate, relatively thin TiN layers $60_1, \ldots, 60_N$ (again, the number of separate layers is considered to be a matter of design choice). In general, the thinner the individual layers (e.g., on the order of <200 Å), the better the conformal coating along sidewalls 66 and bottom surface 68 of via 64.

In accordance with the present invention, any of the various multi-layering processes (or combinations of these processes) discussed above may also be used to form multi-layer TiN nucleation structure 60. The thermal multi-layering process may be preferred in situations where diffusion of tungsten pre-cursors through micro-cracks in the TiN is a concern. The deliberate microstructure mismatch associated with mechanical multi-layering (resulting in unaligned grain boundaries) will also prevent the diffusion of tungsten pre-cursors through the multi-layer TiN structure. Mechanical multi-layering also allows for stress accommodation, thus preventing the junction spiking and "volcano" formation associated with prior art tungsten plug structures. Notwithstanding these attributes of thermal and mechanical multi-layering, it is to be understood that chemical multi-layering may also be used to form the multi-layer TiN nucleation structure illustrated in FIG. 4.

Figure 5:
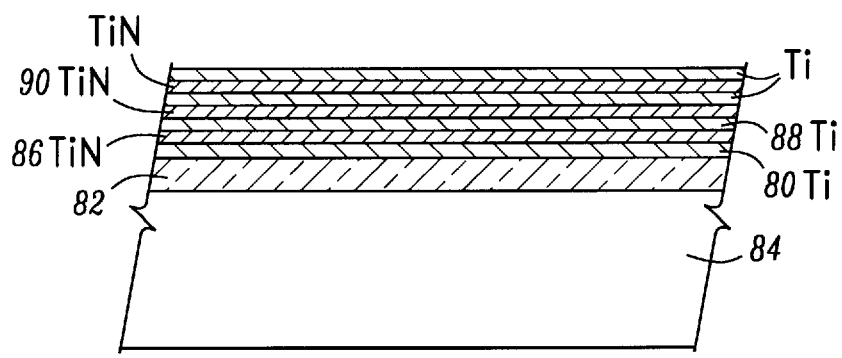
FIG. 5 illustrates an alternative multi-layer TiN contact barrier, including interleaved Ti layers in accordance with the present invention.

FIG. 5 illustrates an alternative multi-layered contact barrier structure formed in accordance with the present invention. In this case, layers of pure Ti are alternated with layers of TiN to form the multi-layered structure. As shown, a first Ti adherence layer 80 is deposited to cover a dielectric layer 82 disposed on the top surface of a substrate 84. A first, relatively thin TiN layer 86 is then deposited over Ti layer 80, where a second, relatively thin Ti layer 88 is then deposited over TiN layer 86, followed by a second TiN layer 90, and so on. The "non-nitrided" physical vapor deposition process is the preferred method to use in the formation of this Ti/TiN/Ti/TiN . . . structure, since as discussed above, the titanium target is not "poisoned" during the TiN deposition process. A particular advantage of this embodiment of the present invention is that titanium is generally tensile, while TN is generally compressive. Therefore, the Ti/TiN/Ti/TiN . . . "stack" may be tailored such that the overall stress state within the multi-layer structure is essentially zero. Additionally, a top layer of titanium, when annealed with the aluminum alloy forms a structure that is reported in the literature to improve resistance to electromigration within the barrier structure. Other techniques may be used, but are not considered as practical. As mentioned above, since pure titanium reacts with tungsten, this mechanical multi-layering structure is suitable for use only with aluminum alloys, such as in contact windows to underlying active regions (e.g., source, gate and drain regions of MOS devices).

What is claimed is:

1. A semiconductor device including a titanium nitride barrier structure between a substrate and a contact metallization region, said semiconductor device comprising:

a semiconductor substrate;

a first dielectric layer formed to cover a predetermined surface region of said substrate;

a first titanium adherence layer of a predetermined thickness deposited to cover a predefined area of said first dielectric layer;

a multi-layered titanium nitride barrier structure comprising separate, relatively thin layers of titanium nitride deposited to cover said first titanium layer, said multi-layered structure comprising chemically multi-layered titanium nitride wherein the individual titanium nitride layers within said structure alternate in composition with respect to the nitrogen to titanium ratio; and a contact metallization region deposited to cover said multi-layered titanium nitride barrier structure.

2. A semiconductor device as defined in claim 1 wherein the multi-layered titanium nitride barrier structure comprises a planar structure used as an interconnect layer for the semiconductor device.

3. A semiconductor device as defined in claim 2 wherein the contact metallization comprises a layer of aluminum-alloy deposited on the multi-layer titanium nitride barrier structure.

4. A semiconductor device as defined in claim 1 wherein the device includes at least one contact via including sidewalls and a bottom surface, the first titanium adherence layer and the multi-layered titanium nitride barrier structure forming a nucleation region along said at least one contact via sidewalls and bottom surface.

5. A semiconductor device as defined in claim 4 wherein the contact metallization comprises a tungsten plug deposited to fill the at least one contact via.

6. A semiconductor device as defined in claim 1 wherein the individual titanium nitride layers within the multi-layer structure alternate in deposition process between a nitrided deposition process and a non-nitrided deposition process.

* * * * *